United States Patent
Su et al.

(10) Patent No.: US 10,971,523 B2
(45) Date of Patent: Apr. 6, 2021

(54) PIXEL ARRAY AND FABRICATION METHOD THEREOF

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Tongshang Su, Beijing (CN); Dongfang Wang, Beijing (CN); Jun Cheng, Beijing (CN); Jun Liu, Beijing (CN); Qinghe Wang, Beijing (CN); Guangyao Li, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/405,126

(22) Filed: May 7, 2019

(65) Prior Publication Data
US 2020/0013806 A1 Jan. 9, 2020

(30) Foreign Application Priority Data
Jul. 3, 2018 (CN) .................... 201810716653.8

(51) Int. Cl.
*H01L 27/12* (2006.01)
*G09G 3/20* (2006.01)
*G09G 3/22* (2006.01)

(52) U.S. Cl.
CPC ....... *H01L 27/1218* (2013.01); *G09G 3/2085* (2013.01); *G09G 3/22* (2013.01)

(58) Field of Classification Search
CPC .......... G09G 3/20; G09G 3/2085; G09G 3/22; H01L 27/1218; H01L 27/1251; H01L 27/127
See application file for complete search history.

(56) References Cited

U.S. PATENT DOCUMENTS

| | | | | |
|---|---|---|---|---|
| 8,487,849 | B2* | 7/2013 | Kim | G02F 1/136213 257/59 |
| 2001/0038098 | A1* | 11/2001 | Yamazaki | H01L 27/3211 257/72 |

(Continued)

FOREIGN PATENT DOCUMENTS

| CN | 102651195 A | 8/2012 |
|---|---|---|
| CN | 104465669 A | 3/2015 |
| CN | 106200092 A | 12/2016 |

OTHER PUBLICATIONS

First Office Action dated Apr. 14, 2020 corresponding to Chinese application No. 201810716653.8.

*Primary Examiner* — Allan R Wilson
(74) *Attorney, Agent, or Firm* — Nath, Goldberg & Meyer; Joshua B. Goldberg

(57) ABSTRACT

The present disclosure provides a pixel array and a fabrication method thereof. The pixel array includes a plurality of gate lines and a plurality of data lines which are arranged intersected and insulated and a pixel unit disposed at a position where each of the plurality of gate lines and each of the plurality of data lines are intersected. The pixel unit includes a thin film transistor (TFT). The width-to-length ratios of channels of the TFTs are sequentially increased in such a manner that the width-to-length ratios of the channels of the TFTs in the pixel units positioned in a same row (and/or a same column) are sequentially increased along a scanning direction of the gate line coupled to gate electrodes of the TFTs in the same row (and/or along a data writing (Continued)

direction of the data line coupled to the source electrodes of the TFTs in the same column).

10 Claims, 2 Drawing Sheets

(56) References Cited

U.S. PATENT DOCUMENTS

| 2009/0174831 | A1* | 7/2009 | Chien | G09G 3/3648 |
| | | | | 349/39 |
| 2010/0009480 | A1 | 1/2010 | Lee | |
| 2011/0221737 | A1* | 9/2011 | Kim | G02F 1/13624 |
| | | | | 345/211 |
| 2015/0228803 | A1* | 8/2015 | Koezuka | H01L 29/7869 |
| | | | | 257/43 |
| 2017/0038648 | A1* | 2/2017 | Liu | G02F 1/134327 |

* cited by examiner

PIXEL ARRAY AND FABRICATION METHOD THEREOF

CROSS-REFERENCE TO RELATED APPLICATION

This application claims the benefit of priority to Chinese Patent Application No. 201810716653.8 filed on Jul. 3, 2018, the contents of which are incorporated herein in their entirety by reference.

TECHNICAL FIELD

The present disclosure relates to a field of display technology, and particularly relates to a pixel array and a fabrication method thereof.

BACKGROUND

A pixel array generally includes a plurality of gate lines and a plurality of data lines which are arranged intersected and insulated. When the gate lines are scanned line by line, thin film transistors (TFTs) on each row are turned on one by one. At this time, data voltage signals written into the data lines will be stored in storage capacitors. When the scanning of the gate lines is stopped, the storage capacitors are used to supply voltages across liquid crystal capacitors electrically coupled thereto, so that the voltage across the liquid crystal capacitors remain unchanged after the scanning is stopped, so as to achieve a purpose of displaying screens.

SUMMARY

According to an aspect of the present disclosure, there is provided a pixel array including a plurality of gate lines and a plurality of data lines which are arranged intersected and insulated; and a pixel unit disposed at a position where each of the plurality of gate lines and each of the plurality of data lines are intersected, the pixel unit including a thin film transistor (TFT), wherein width-to-length ratios of channels of the TFTs are sequentially increased in at least one of a manner in which the width-to-length ratios of the channels of the TFTs in the pixel units positioned in a same row are sequentially increased along a scanning direction of the gate line coupled to gate electrodes of the TFTs in the same row and a manner in which the width-to-length ratios of the channels of the TFTs in the pixel units positioned in a same column are sequentially increased along a data writing direction of the data line coupled to source electrodes of the TFTs in the same column.

According to an embodiment of the present disclosure, each of the plurality of gate lines includes a first end and a second end that are oppositely disposed, and the scanning direction of one gate line of any two adjacent gate lines is a direction from the first end to the second end, the scanning direction of the other gate line of the two adjacent gate lines is a direction from the second end to the first end.

According to an embodiment of the present disclosure, each of the plurality of gate lines includes a first end and a second end that are oppositely disposed, the scanning direction of each gate line includes a direction from the first end to the second end or a direction from the second end to the first end.

According to an embodiment of the present disclosure, the pixel unit further includes a storage capacitor and a liquid crystal capacitor, and a first electrode of the storage capacitor is electrically coupled to a drain electrode of the TFT and a first electrode of the liquid crystal capacitor, and a second electrode of the storage capacitor and a second electrode of the liquid crystal capacitor are electrically coupled to a ground line, in the pixel unit.

According to an embodiment of the present disclosure, the TFT includes any one of a Top Gate Top Contact type TFT, a Top Gate Bottom Contact type TFT, a Bottom Gate Top Contact type TFT and a Bottom Gate Bottom Contact type TFT.

According to an embodiment of the present disclosure, the TFT is the Top Gate Top Contact type TFT, and the TFT includes: a first substrate; an active layer disposed on the first substrate and including a conductorized region and a channel, the conductorized region being disposed on both sides of the channel; an interlayer insulating layer disposed on the first substrate and the active layer and covering the first substrate and the active layer; a source electrode and a drain electrode disposed on the interlayer insulating layer and electrically coupled to the conductorized region of the active region via a source contact hole and a drain contact hole respectively; a gate insulating layer disposed on a side of the active layer facing away from the first substrate and covering the channel; a gate electrode disposed in the interlayer insulating layer and disposed on a side of the gate insulating layer facing away from the active layer; a passivation layer disposed on a side of the interlayer insulating layer facing away from the first substrate and covering the source electrode and the drain electrode.

According to another aspect of the present disclosure, there is provided a fabrication method of a pixel array including forming a plurality of gate lines and a plurality of data lines which are arranged intersected and insulated, wherein a pixel unit is formed at a position where each of the plurality of gate lines and each of the plurality of data lines are intersected, wherein forming the pixel unit includes forming a structure of a TFT in the pixel unit, wherein width-to-length ratios of channels of the formed TFTs are sequentially increased in at least one of a manner in which the width-to-length ratios of the channels of the TFTs in the pixel units positioned in a same row are sequentially increased along a scanning direction of the gate line coupled to the gate electrodes of the TFTs in the same row and a manner in which the width-to-length ratios of the channels of the TFTs in the pixel units positioned in a same column are sequentially increased along a data writing direction of the data line coupled to the source electrodes of the TFTs in the same column.

According to an embodiment of the present disclosure, the TFT is a Top Gate Top Contact type TFT, and the forming the structure of the TFT includes forming a pattern of an active layer on the first substrate by a first patterning process; forming a pattern including a gate electrode and a pattern including a gate insulating layer by a second patterning process, the gate electrode being electrically coupled to the gate lines; forming a interlayer insulating layer and forming a source contact hole and a drain contact hole in the interlayer insulating layer; forming a pattern of a source electrode and a drain electrode by a third patterning process, the source electrode being electrically coupled to a source contact region of the active layer via the source contact hole, the source electrode being electrically coupled to the data lines, the drain electrode being electrically coupled to a drain contact region of the active layer via the drain contact hole.

According to an embodiment of the present disclosure, forming the pattern of the active layer on the first substrate by the first patterning process includes: forming a pattern including a conductorized region and a channel on the first substrate; patterning the pattern including the conductorized region and the channel on the first substrate to form the conductorized region and the channel, wherein an orthographic projection of the gate insulating layer on the first substrate covers an orthographic projection of the channel on the first substrate.

According to an embodiment of the present disclosure, the fabrication method of the pixel array further includes: forming a storage capacitor and a liquid crystal capacitor, a first electrode of the storage capacitor being electrically coupled to the drain electrode of the TFT and a first electrode of the liquid crystal capacitor, and a second electrode of the storage capacitor and a second electrode of the liquid crystal capacitor being electrically coupled to a ground line.

DETAILED DESCRIPTION

To make those skilled in the art better understand the technical solutions of the present disclosure, the present disclosure will be further described in detail below in conjunction with the accompanying drawings and the specific implementations.

Figure 1:
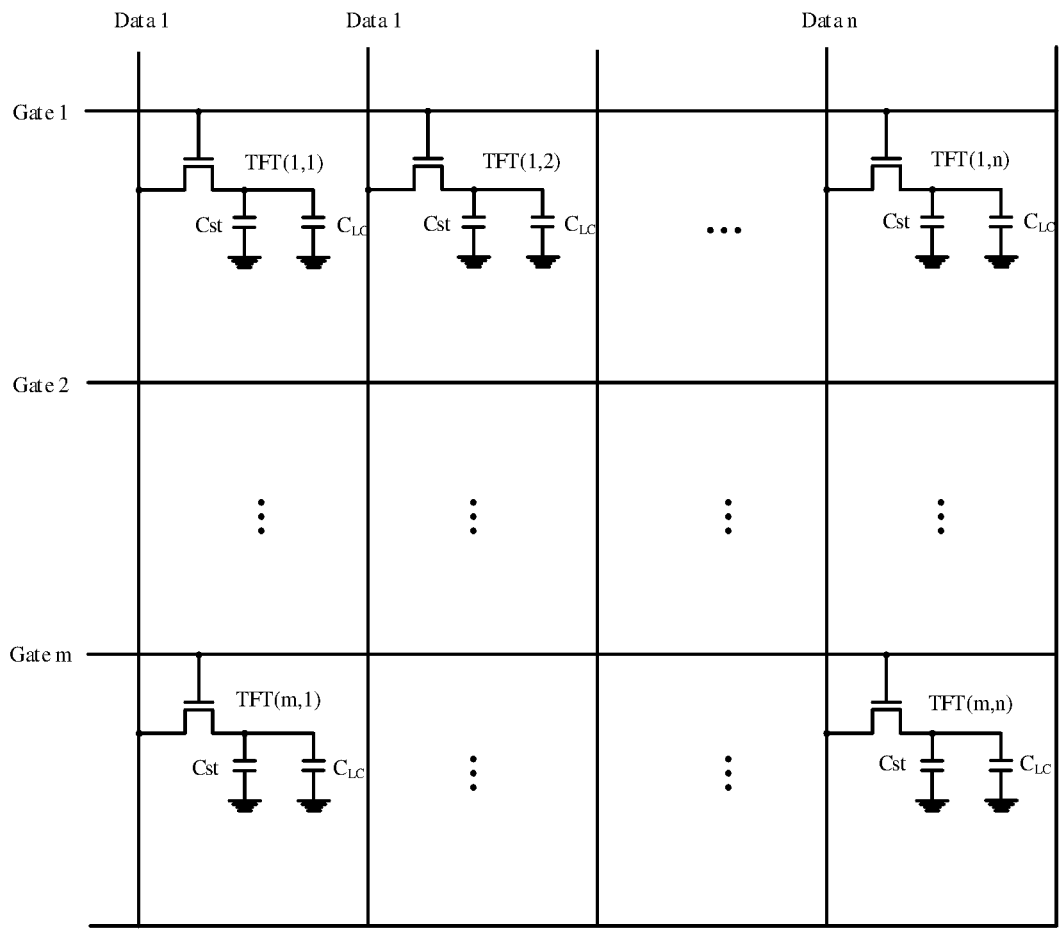
FIG. 1 is a schematic diagram of a pixel array according to an embodiment of the present disclosure.

FIG. 1 is a schematic diagram of a pixel array according to an embodiment of the present disclosure.

As shown in FIG. 1, a pixel array according to an embodiment of the present disclosure includes a plurality of gate lines and a plurality of data lines which are arranged intersected and insulated, and a plurality of pixel units arranged at positions where the plurality of gate lines and the plurality of data lines are intersected. The intersection between each gate line and each data line defines one pixel unit. Each pixel unit includes a TFT, a storage capacitor $C_{st}$ and a liquid crystal capacitor $C_{LC}$, a source electrode of the TFT is coupled to a corresponding data line, and a gate electrode of the TFT is coupled to a corresponding gate line. A first electrode of the storage capacitor $C_{st}$ is electrically coupled to a drain electrode of the TFT and a first electrode of the liquid crystal capacitor $C_{LC}$, and a second electrode of the storage capacitor $C_{st}$ and a second electrode of the liquid crystal capacitor $C_{LC}$ are electrically coupled to a ground line.

In the pixel array according to an embodiment of the present disclosure, width-to-length ratios of channels of the TFTs are sequentially increased in at least one of a manner in which the width-to-length ratios of the channels of the TFTs in the pixel units positioned in a same row are sequentially increased along a scanning direction of the gate line coupled to the gate electrodes of the TFTs in the same row and a manner in which the width-to-length ratios of the channels of the TFTs in the pixel units positioned in a same column are sequentially increased along a data writing direction of the data line coupled to the source electrodes of the TFTs in the same column.

According to the embodiment of the present disclosure, the scanning direction of the gate line may include a direction from a first end of the gate line toward a second end of the gate line or a direction from the second end of the gate line to the first end of the gate line. For example, the scanning directions of the gate lines in FIG. 1 may be a direction in which each gate line is scanned from left end to right end, a direction in which each gate line is scanned from the right end to the left end, or directions in which one gate line is scanned from the left end to the right end and the other gate line is scanned from the right end to the left end for any two adjacent gate lines.

According to the embodiment of the present disclosure, the TFT in each pixel unit includes any one of a Top Gate Top Contact type TFT, a Top Gate Bottom Contact type TFT, a Bottom Gate Top Contact type TFT and a Bottom Gate Bottom Contact type TFT.

For convenience of description of the present disclosure, the Top Gate Top Contact type TFT will be described below as an example, but the embodiment of the present disclosure is not limited thereto.

Figure 2:
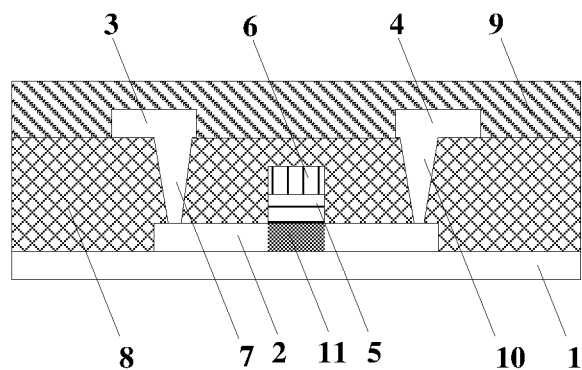
FIG. 2 is a schematic structural diagram of a TFT according to an embodiment of the present disclosure.

FIG. 2 is a schematic structural diagram of a TFT according to an embodiment of the present disclosure.

The TFT according to the embodiment of the present disclosure includes a first substrate 1, an active layer 2, a source electrode 3, a drain electrode 4, a gate insulating layer 5, a gate electrode 6, a source contact hole 7, an interlayer insulating layer 8, a passivation layer 9 and a drain contact hole 10.

According to the embodiment of the present disclosure, the active layer 2 is disposed on the first substrate 1 and includes a conductorized region and a channel. For example, a gray region 11 in the active layer 2 below the gate insulating layer 5 is the channel, and the remaining region in the active layer 2 is the conductorized region. The channel described above is only an example, which is not intended to limit the present disclosure, and the channel may also be located in a region that is smaller than the gray region 11 below the gate insulating layer 5. The source electrode 3 and the drain electrode 4 are disposed on the interlayer insulating layer 8, and are electrically coupled to the conductorized region in the active layer through the source contact hole 7 and the drain contact hole 10, respectively. The gate insulating layer 5 is disposed on a side of the active layer 2 facing away from the first substrate 1 of the active layer 2 and covers the channel. The gate electrode 6 is disposed on a side of the gate insulating layer 5 of the gate insulating layer 5 facing away from the active layer 2 of the gate insulating layer 5. The interlayer insulating layer 8 is disposed on the first substrate 1 and the active layer 2 and covers the first substrate 1 and the active layer 2. The passivation layer 9 is disposed on a side of the interlayer insulating layer 8 facing away from the first substrate 1 and covers the source electrode 3 and the drain electrode 4.

In the TFT according to the embodiment of the present disclosure, a current $I_{DS}$ flowing through the source electrode 3 and the drain electrode 4 of the TFT is defined by $I_{DS}=\frac{1}{2}\times[\mu\times C\times W/L\times(V_{GS}-V_{TH})2]$, wherein $\mu$ is mobility ratio of the active layer 2, C is capacitance per unit area formed by the gate electrode 6 of the TFT and the active layer 2 of the TFT, W/L is the width-to-length ratio of the channel of the TFT, $V_{GS}$ is a voltage difference between the gate electrode 6 and the source electrode 3 and $V_{TH}$ is a threshold voltage of the TFT. It can be seen that the current $I_{DS}$ flowing through the source electrode 3 and the drain electrode 4 of the TFT is proportional to the width-to-length ratio W/L of the channel, that is, the larger the width-to-length ratio W/L, the larger the current $I_{DS}$ flowing through the source electrode 3 and the drain electrode 4 of the TFT.

In this way, in the pixel array as shown in FIG. 1, when the width-to-length ratios of the channels of the TFTs in the pixel units positioned in the same row are sequentially increased along the scanning direction of the gate line coupled to the gate electrodes of the TFTs in the same row and/or the width-to-length ratios of the channels of the TFTs in the pixel units positioned in the same column are sequentially increased along the data writing direction of the data line coupled to the source electrodes of the TFTs in the same column, the currents $I_{DS}$ flowing through the source electrodes 3 and the drain electrodes 4 of the TFTs in the pixel units positioned in the same row and/or the same column are also sequentially increased. Therefore the increased currents $I_{DS}$ may compensate for the voltage drop that is lost during the transmission in the gate lines and/or the data lines, thereby ensuring that the amount of charge stored in the storage capacitor $C_{st}$ coupled to each TFT in different rows and/or different columns is the same, so that the voltage across each liquid crystal capacitor $C_{LC}$ coupled to each storage capacitor $C_{st}$ in different rows and/or different columns is also the same, so as to improve the uniformity of a display panel fabricated by the pixel array provided by the embodiment, and improve the display effect of the display panel.

According to the embodiment of the present disclosure, when the width-to-length ratios of the channels of the TFTs in the pixel units positioned in the xth row are sequentially increased along the scanning direction of the gate line (that is, when $(W/L)_{(x, 1)} < (W/L)_{(x, 2)} < \ldots < (W/L)_{(x, n)}$), the currents flowing through the source electrodes 3 and the drain electrodes 4 of the TFTs in the pixel units positioned in the xth row are sequentially increased along the scanning direction of the gate line of the xth row (that is, $I_{DS(x, 1)} < I_{DS(x, 2)} < \ldots < I_{DS(x, n)}$). It can be seen that even a voltage signal written into the gate line decreases as a length of the gate line increases, the currents $I_{DS}$ sequentially increased along the scanning direction of the gate line can compensate for the voltage drop that the gate line loses during the transmission of the gate voltage signal so that the amount of the charge stored in the storage capacitor $C_{st}$ coupled to each TFT in the xth row is the same. Therefore when the scanning of the gate line is stopped, the voltage across each liquid crystal capacitor $C_{LC}$ in the xth row is also the same, thereby improving the uniformity of the display panel fabricated by the pixel array and improving the display effect of the display panel.

According to the embodiment of the present disclosure, when the width-to-length ratios of the channels of the TFTs in the pixel units positioned in the yth column are sequentially increased along the data written direction of the data line (that is, when $(W/L)_{(1, y)} < (W/L)_{(2, y)} < \ldots < (W/L)_{(n, y)}$), the currents flowing through the source electrodes 3 and the drain electrodes 4 of the TFTs in the pixel units positioned in the yth column are sequentially increased along the data written direction of the data line of the yth column (that is, $I_{DS(1, y)} < I_{DS(2, y)} < \ldots < I_{DS(n, y)}$). It can be seen that even the data voltage signal written into the data line decreases as a length of the data line increases, the currents $I_{DS}$ sequentially increased along the data written direction of the data line can compensate for the voltage drop that the data line loses during the transmission of the data voltage signal so that the amount of the charge stored in the storage capacitor $C_{st}$ coupled to each TFT in the yth column is the same. Therefore when the scanning of the gate line is stopped, the voltage across each liquid crystal capacitor $C_{LC}$ in the yth column is also the same, thereby improving the uniformity of the display panel fabricated by the pixel array and improving the display effect of the display panel.

According to the embodiment of the present disclosure, when the width-to-length ratios of the channels of the TFTs in the pixel units positioned in the xth row are sequentially increased along the scanning direction of the gate line and the width-to-length ratios of the channels of the TFTs in the pixel units positioned in the yth column are sequentially increased along the data written direction of the data line (that is, when $(W/L)_{(x, 1)} < (W/L)_{(x, 2)} < \ldots < (W/L)_{(x, n)}$ and $(W/L)_{(1, y)} < (W/L)_{(2, y)} < \ldots < (W/L)_{(n, y)}$ and when $(W/L)_{(x, 1)} < (W/L)_{(x, 2)} < \ldots < (W/L)_{(x, n)}$ and $(W/L)_{(1, y)} < (W/L)_{(2, y)} < \ldots < (W/L)_{(n, y)}$), the currents flowing through the source electrodes 3 and the drain electrodes 4 of the TFTs in the pixel units positioned in the xth row are sequentially increased along the scanning direction of the gate line of the xth row (that is, $I_{DS(x, 1)} < I_{DS(x, 2)} < \ldots < I_{DS(x, n)}$), and the currents flowing through the source electrodes 3 and the drain electrodes 4 of the TFTs in the pixel units positioned in the yth column are sequentially increased along the data written direction of the data line of the yth column (that is, $I_{DS(1, y)} < I_{DS(2, y)} < \ldots < I_{DS(n, y)}$). It can be seen that even the gate voltage signal written into the gate line and the data voltage signal written into the data line decrease as the lengths of the metal wires increase, the currents $I_{DS}$ sequentially increased along the scanning direction of the gate line and the data written direction of the data line can compensate for the voltage drop that the gate line and the data line lose during the transmission of the signals so that the amount of the charge stored in the storage capacitor Cst coupled to each TFT in the xth row and the yth column is the same. Therefore when the scanning of the gate line is stopped, the voltage across each liquid crystal capacitor $C_{LC}$ in the xth row and the yth column is also the same, thereby improving the uniformity of the display panel fabricated by the pixel array and improving the display effect of the display panel.

Figure 3:
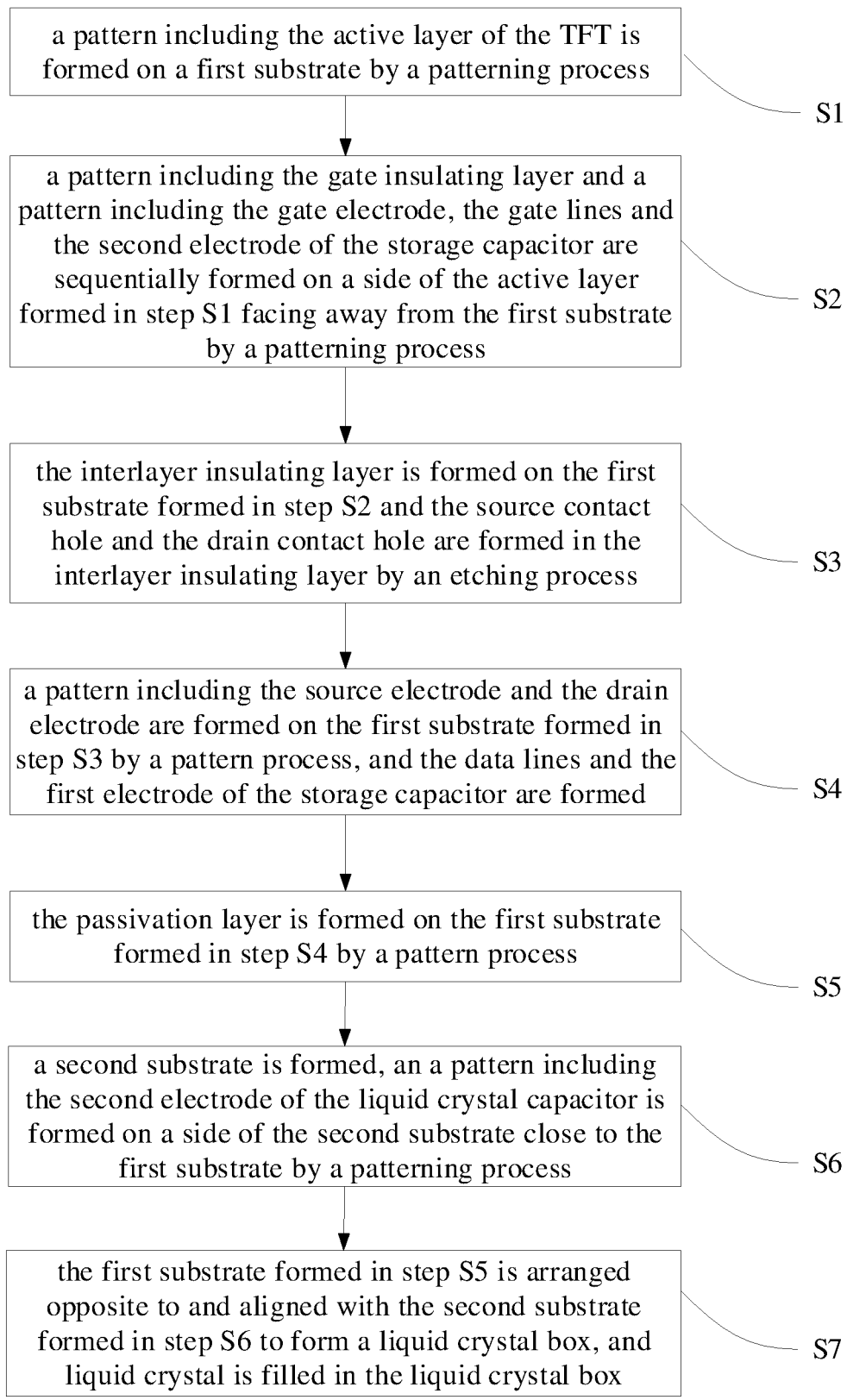
FIG. 3 is a flow chart of a fabrication method of a pixel array according to an embodiment of the present disclosure.

FIG. 3 is a flow chart of a fabrication method of the pixel array according to the embodiment of the present disclosure.

For convenience of description of the present disclosure, the Top Gate Top Contact type TFT will be described below as an example, but the embodiment of the present disclosure is not limited thereto. The TFT in each pixel unit includes any one of a Top Gate Top Contact type TFT, a Top Gate Bottom Contact type TFT, a Bottom Gate Top Contact type TFT and a Bottom Gate Bottom Contact type TFT. Specifically, the fabrication method includes step S1 to S7.

Referring to FIG. 2 and FIG. 3, in step S1, a pattern including the active layer 2 of the TFT is formed on a first substrate by a patterning process.

According to the embodiment of the present disclosure, the active layer 2 includes a conductorized region and a channel. For example, a gray region 11 in the active layer 2 below the gate insulating layer 5 is the channel, and the remaining region in the active layer 2 is the conductorized region. The channel described above is only an example, which is not intended to limit the present disclosure, and the channel may also be located in a region below the gate insulating layer 5 that is smaller than the gray region 11.

Specifically, a pattern including the conductorized region and the channel may be formed on the first substrate 1 by a patterning process, and the pattern is patterned to form the conductorized region and the channel, thereby forming the active layer 2. The channel is located below the gate insulating layer subsequently formed, and an orthographic projection of the gate insulating layer on the first substrate 1 covers an orthographic projection of the channel on the first substrate 1.

Width-to-length ratios of the formed channels of the TFTs may be sequentially increased in at least one of a manner in which the width-to-length ratios of the channels of the TFTs in the pixel units positioned in a same row are sequentially increased along a scanning direction of the gate line coupled to the gate electrodes of the TFTs in the same row and a manner in which the width-to-length ratios of the channels of the TFTs in the pixel units positioned in a same column are sequentially increased along a data writing direction of the data line coupled to the source electrodes of the TFTs in the same column.

For example, the pattern including the active layers of the TFTs which includes patterns of the conductorized regions and the channels may be formed on the first substrate by a photolithography process. Specifically, a layer of photoresist may be coated on the first substrate 1 to transfer a pattern on a mask to the first substrate 1 by ultraviolet rays, thereby forming the patterns including the conductorized regions and the channels on the first substrate 1, and forming the conductorized regions and the channels on the first substrate 1 by patterning the patterns. For example, the change of the aspect ratios of the channels can be achieved by previously fabricating a pattern corresponding to the channels of the TFTs on the mask. For example, if it is desired to fabricate a pixel array in which the width to length ratios of the channels of the TFTs are sequentially increased along the scanning directions of the gate lines, and the scanning direction of each gate line is from left to right, a pattern in which the width to length ratios of the channels are sequentially increased from left to right may be fabricated in advance on the mask. For example, the sequential change of the channels in the pattern including the conductorized regions and the channels can be realized by at least one of sequentially increasing the channel width from left to right and decreasing the channel length from left to right, thereby realizing the width to length ratios of the pattern of the channels of the TFTs formed by photolithography are sequentially changed along at least one of the scanning direction of the gate line and the writing direction of the data line.

At step S2, a pattern including the gate insulating layer 5 and a pattern including the gate electrode 6, the gate line, and the second electrode of the storage capacitor $C_{st}$ are sequentially formed on a side of the active layer 2 formed in step S1 facing away from the first substrate 1 by a patterning process. The gate electrode 6 of the TFT is electrically coupled to the gate line, and the second electrode of the storage capacitor $C_{st}$ is electrically coupled to the ground line.

At step S3, the interlayer insulating layer 8 is formed on the first substrate formed in step S2, and the source contact hole 7 and drain contact hole 10 are formed in the interlayer insulating layer 8 by an etching process.

At step S4, the source electrode 3 and the drain electrode 4 of the TFT are formed on the first substrate formed in step S3 by a patterning process, and the data line and the first electrode of the storage capacitor $C_{st}$ are formed. The source electrode 3 of the TFT is electrically coupled to the source contact region of the active layer 2 through the source contact hole 7 and is electrically coupled to the data line, the drain electrode 4 of the TFT is electrically coupled to the drain contact region of the active layer 2 through the drain contact hole 10, and the drain electrode 4 of the TFT is also electrically coupled to the first electrode of the storage capacitor $C_{st}$ and the first electrode of the liquid crystal capacitor $C_{LC}$.

At step S5, the passivation layer 9 is formed on the first substrate formed in step S4 by a patterning process.

At step S6, a second substrate is formed, and a pattern including the second electrode of the liquid crystal capacitor $C_{LC}$ is formed on a side of the second substrate close to the first substrate 1 by a patterning process. Usually, the second electrode of the liquid crystal capacitor $C_{LC}$ is also a common electrode.

According to the embodiment of the present disclosure, step S6 may be performed before step S1, or may be performed simultaneously with step S1, which is not limited herein.

At step S7, the first substrate formed in step S5 is arranged opposite to and aligned with the second substrate formed in step S6 to form a liquid crystal box, and liquid crystal is filled in the liquid crystal box, thereby completing the fabrication of the pixel array.

Since the width-to-length ratios of the channels of the TFTs in the pixel units of the pixel array fabricated by the fabrication method according to the embodiment of the present disclosure may be sequentially increased in at least one of a manner in which the width-to-length ratios of the channels of the TFTs in the pixel units positioned in a same row are sequentially increased along the scanning direction of the gate line coupled to the TFTs in the same row and a manner in which the width-to-length ratios of the channels of the TFTs in the pixel units positioned in a same column are sequentially increased along the data writing direction of the data line coupled to the TFTs in the same column, the currents flowing through the source electrodes 3 and the drain electrodes 4 in the pixel units will increase along at least one of the scanning direction of the gate lines and the data written direction of the data lines. Therefore the amount of the charge stored in the storage capacitor $C_{st}$ coupled to each TFT in different rows and/or different columns is the same to make the voltage across each liquid crystal capacitor $C_{LC}$ is also the same, thereby improving the uniformity of the display panel fabricated by the pixel array and improving the display effect of the display panel.

Further, a display panel according to the embodiment of the present disclosure may include the pixel array as shown in FIG. 1.

Since the display panel according to the embodiment of the present disclosure includes the above-described pixel array, the display effect thereof is better. Further, the display device according to the embodiment of the present disclosure may include the above display panel. The display device according to the embodiment of the present disclosure may be at least one of a product or a component having a display function such as a mobile phone, a tablet computer, a television set, a display, a notebook computer, a digital photo frame, a navigator, and the like.

Further, other conventional structures such as a backlight, a power supply unit, a display driving unit, and the like may be included in the display device according to the embodiment of the present disclosure.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. A pixel array, comprising:
   a plurality of gate lines and a plurality of data lines which are arranged intersected and insulated; and
   a pixel unit disposed at a position where each of the plurality of gate lines and each of the plurality of data lines are intersected, wherein the pixel unit comprises a thin film transistor (TFT),
each gate line comprises one end at which a scan signal is supplied, each data line comprises one end at which a data signal is supplied,
wherein for any two pixel units positioned in a same row, a width-to-length ratio of a channel of the TFT in one pixel unit which is positioned closer to the end of a corresponding gate line at which the scan signal is supplied is smaller than a width-to-length ratio of a channel of the TFT in the other pixel unit which is positioned farther from the end of the corresponding gate line at which the scan signal is supplied; and/or
for any two pixel units positioned in a same column, a width-to-length ratio of a channel of the TFT in one pixel unit which is positioned closer to the end of a corresponding data line at which the data signal is supplied is smaller than a width-to-length ratio of a channel of the TFT in the other pixel unit which is positioned farther from the end of the corresponding data line at which the data signal is supplied.

2. The pixel array according to claim 1, wherein each of the plurality of gate lines comprises a first end and a second end that are oppositely disposed, and
a scanning direction of one gate line of any two adjacent gate lines is a direction from the first end to the second end, a scanning direction of the other gate line of the two adjacent gate lines is a direction from the second end to the first end.

3. The pixel array according to claim 1, wherein each of the plurality of gate lines comprises a first end and a second end that are oppositely disposed,
a scanning direction of each gate line comprises a direction from the first end to the second end or a direction from the second end to the first end.

4. The pixel array according to claim 1, wherein the pixel unit further comprises a storage capacitor and a liquid crystal capacitor, and
wherein a first electrode of the storage capacitor is electrically coupled to a drain electrode of the TFT and a first electrode of the liquid crystal capacitor, and a second electrode of the storage capacitor and a second electrode of the liquid crystal capacitor are electrically coupled to a ground line, in the pixel unit.

5. The pixel array according to claim 1, wherein the TFT comprises any one of a Top Gate Top Contact type TFT, a Top Gate Bottom Contact type TFT, a Bottom Gate Top Contact type TFT and a Bottom Gate Bottom Contact type TFT.

6. The pixel array according to claim 5, wherein the TFT is the Top Gate Top Contact type TFT, and the TFT comprises:
a first substrate;
an active layer disposed on the first substrate and comprising a conductorized region and a channel, the conductorized region being disposed on both sides of the channel;
an interlayer insulating layer disposed on the first substrate and the active layer and covering the first substrate and the active layer;
a source electrode and a drain electrode disposed on the interlayer insulating layer and electrically coupled to the conductorized region of the active region via a source contact hole and a drain contact hole respectively;
a gate insulating layer disposed on a side of the active layer facing away from the first substrate and covering the channel;
a gate electrode disposed in the interlayer insulating layer and disposed on a side of the gate insulating layer facing away from the active layer;
a passivation layer disposed on a side of the interlayer insulating layer facing away from the first substrate and covering the source electrode and the drain electrode.

7. A fabrication method of a pixel array, comprising:
forming a plurality of gate lines and a plurality of data lines which are arranged intersected and insulated, wherein a pixel unit is formed at a position where each of the plurality of gate lines and each of the plurality of data lines are intersected, wherein
forming the pixel unit comprises forming a structure of a thin film transistor (TFT) in the pixel unit, and
each gate line comprises one end at which a scan signal is supplied, each data line comprises one end at which a data signal is supplied,
wherein for any two pixel units positioned in a same row, a width-to-length ratio of a channel of the TFT in one pixel unit which is positioned closer to the end of a corresponding gate line at which the scan signal is supplied is smaller than a width-to-length ratio of a channel of the TFT in the other pixel unit which is positioned farther from the end of the corresponding gate line at which the scan signal is supplied; and/or
for any two pixel units positioned in a same column, a width-to-length ratio of a channel of the TFT in one pixel unit which is positioned closer to the end of a corresponding data line at which the data signal is supplied is smaller than a width-to-length ratio of a channel of the TFT in the other pixel unit which is positioned farther from the end of the corresponding data line at which the data signal is supplied.

8. The fabrication method of the pixel array according to claim 7, wherein the TFT is a Top Gate Top Contact type TFT, and the forming the structure of the TFT comprises:
forming a pattern of an active layer on the first substrate by a first patterning process;
forming a pattern comprising a gate electrode and a pattern comprising a gate insulating layer by a second patterning process, the gate electrode being electrically coupled to the gate line;
forming a interlayer insulating layer and forming a source contact hole and a drain contact hole in the interlayer insulating layer;
forming a pattern of a source electrode and a drain electrode by a third patterning process, the source electrode being electrically coupled to a source contact region of the active layer via the source contact hole, the source electrode being electrically coupled to the data lines, and the drain electrode being electrically coupled to a drain contact region of the active layer via the drain contact hole.

9. The fabrication method of the pixel array according to claim 8, wherein forming the pattern of the active layer on the first substrate by the first patterning process comprises:
forming a pattern comprising a conductorized region and a channel on the first substrate;
patterning the pattern comprising the conductorized region and the channel on the first substrate to form the conductorized region and the channel, wherein an orthographic projection of the gate insulating layer on the first substrate covers an orthographic projection of the channel on the first substrate.

10. The fabrication method of the pixel array according to claim 9, further comprising:

forming a storage capacitor and a liquid crystal capacitor, wherein a first electrode of the storage capacitor is electrically coupled to the drain electrode of the TFT and a first electrode of the liquid crystal capacitor, and a second electrode of the storage capacitor and a second electrode of the liquid crystal capacitor are electrically coupled to a ground line.

* * * * *